United States Patent [19]

Elmis

[11] Patent Number: 4,471,299
[45] Date of Patent: Sep. 11, 1984

[54] CIRCUIT FOR DIGITAL PHASE DIFFERENCE MEASURING AND SYNCHRONIZING BETWEEN PULSE TRAINS

[75] Inventor: Herbert Elmis, Denzlingen, Fed. Rep. of Germany

[73] Assignee: ITT Industries, Inc., New York, N.Y.

[21] Appl. No.: 509,979

[22] Filed: Jun. 30, 1983

Related U.S. Application Data

[63] Continuation of Ser. No. 276,573, Jun. 23, 1981, abandoned.

[30] Foreign Application Priority Data

Jul. 4, 1980 [DE] Fed. Rep. of Germany ....... 3025356

[51] Int. Cl.³ ............................................ G01R 25/00
[52] U.S. Cl. .............................. 324/83 D; 324/79 D; 307/269; 328/133
[58] Field of Search ............... 324/78 D, 79 D, 83 D; 307/269; 332/9; 328/133, 134

[56] References Cited

U.S. PATENT DOCUMENTS

| 2,980,858 | 4/1961 | Grondin et al. | 324/83 D |
| 3,297,947 | 1/1967 | Riordan et al. | 324/83 D |
| 3,820,022 | 6/1974 | Watt | 324/83 D |
| 3,930,199 | 12/1975 | Valis | 324/83 D |
| 4,001,682 | 1/1977 | Watt | 324/83 D |

Primary Examiner—Michael J. Tokar
Attorney, Agent, or Firm—Donald J. Lenkszus

[57] ABSTRACT

A circuit for digitally evaluating the magnitude of the phase error between a reference and a locally generated train (sequence) of pulses. The reference train (sequence) may be, for example, the received horizontal sync pulse in a television receiver and the locally generated synchronizable horizontal trigger of the receiver. The reference pulse train (sequence) contains statistical noise and noise pulses and by multiple phase error sampling (digital) and averaging a much more accurate phase error measurement is obtained. Circuits for directly synchronizing the local trigger generator from the measured phase error are also included.

45 Claims, 2 Drawing Figures

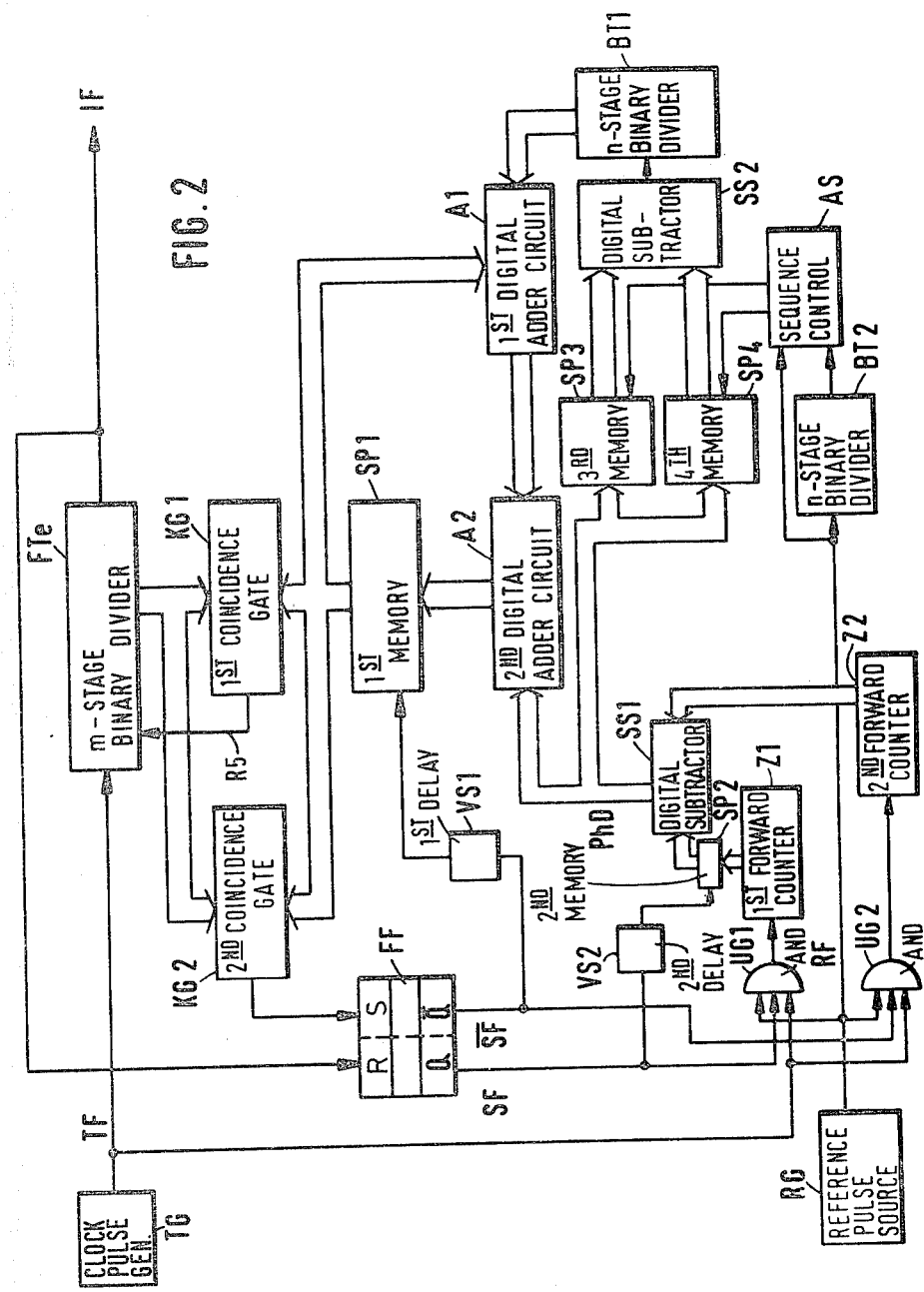

4,471,299

CIRCUIT FOR DIGITAL PHASE DIFFERENCE MEASURING AND SYNCHRONIZING BETWEEN PULSE TRAINS

This application is a continuation of application Ser. No. 276,573, filed June 23, 1981 now abandoned.

BACKGROUND OF THE INVENTION

1. Field of the Invention

The invention relates to a circuit for the digital measuring of the difference in phase between a sequence of reference pulses, in particular a transmitted one, and a pulse sequence resulting as the output signal from a frequency divider for a clock signal whose frequency is higher by at least one order than that of the pulse sequence. Moreover, the invention relates to a use of this circuit for synchronizing the pulse sequence with the reference pulse sequence, as well as to a corresponding circuit arrangment.

2. Description of the Prior Art

The invention is particularly suitable for synchronizing the horizontal deflection in television receivers. In this particular case, the reference pulse sequence is represented by the transmitted horizontal sync pulses which, as is well known, are separated in the television receiver in the conventional way from the picture amplitude synchronizing signal. In respect to th so-called phase-locked oscillator circuits of the prior art, for example, in frequency synthesizers, phase-difference measuring plays a part. Such phase-locked oscillators consist of a frequency-controlled oscillator, a phase measuring circuit between the oscillator and reference signals, and a filter circuit for smoothing the control of the oscillator, using conventional analog techniques. Such filters are often relatively expensive and analog instrumentation is inherently susceptible to impreciseness because of noise.

It is possible to instrument phase measurement digitally, however, omnipresent noise pulses superimposed on the reference signal (received synchronizing pulse train (sequence) in the television case) tend to make the measurement imprecise.

The manner in which the invention deals with prior art disadvantages to produce a novel and effective digital phase measuring circuit (and synchronizer circuit) will be evident as the description proceeds.

SUMMARY OF THE INVENTION

It is the general object of the invention to provide a digital phase difference (error) measuring circuit supplying accurate measured values in the presence of statistically distributed noise pulses or signals or both. According to the invention, the object is achieved by digitally counting between corresponding signals of the reference pulse train (sequence) (received TV sync signal train (sequence), for example) and the locally generated pulse train (sequence) to be synchronized therewith. The circuits of the invention provide for averaging of the measured phase error over a predetermined period (predetermined number of successive pulses of each pulse train (sequence)) to average out the effect of statistically distributed noise and noise pulses on relative phase measurement accuracy.

The invention will be hereinafter described with reference to the drawings.

BRIEF DESCRIPTION OF THE DRAWINGS

FIG. 2, schematically in the form of a block diagram, shows a circuit for effecting synchronizing according to an aspect of the invention.

DETAILED DESCRIPTION OF THE DRAWINGS

Figure 1:
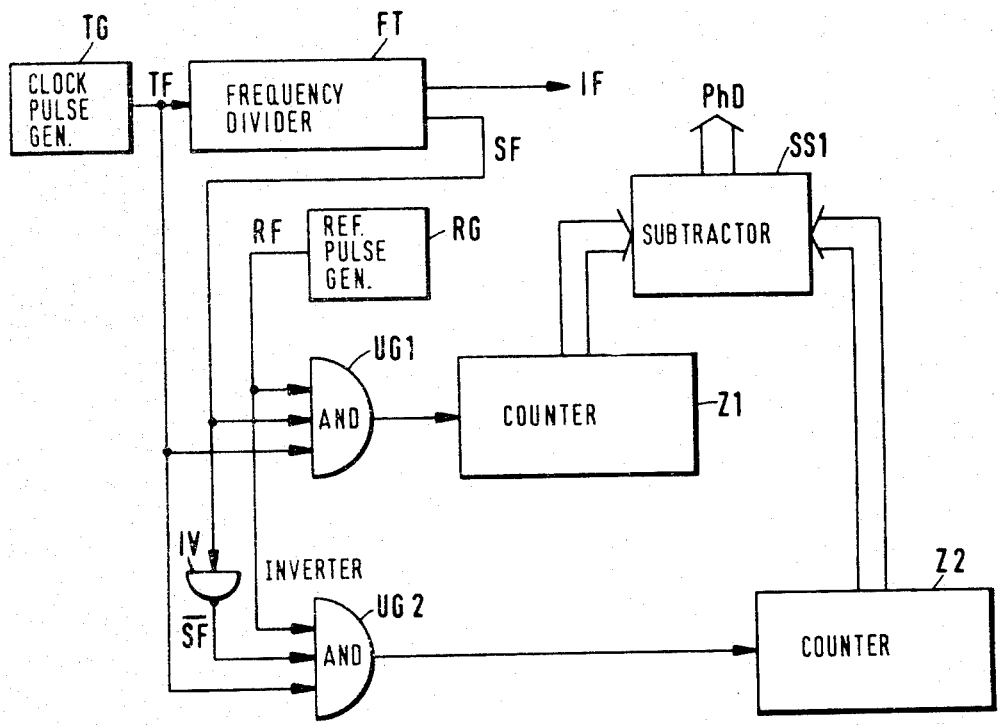
FIG. 1, schematically shows by way of a block diagram, one embodiment of the invention.

The schematic block diagram of FIG. 1 shows the clock pulse generator TG for the clock signal TF which is fed to the input of the frequency divider FT. Extant at the output of the frequency divider FT is the pulse sequence IF whose phase difference with respect to the sequence of reference pulses RF is to be measured. This sequence is generated by the reference pulse generator RG which, for example, may be the horizontal sync pulse separating circuit of a television receiver.

Separately from the pulse sequence IF, the switching signal SF is derived from the frequency divider FT, this signal having double the frequency of the pulse sequence IF and a pulse/no-pulse ratio of 1:1.

To each of the three inputs of the first AND gate UG1 and the three inputs of the second AND gate UG2, the clock signal TF and the reference pulse sequence RF are fed on separate inputs. The switching signal SF is fed to the third UG1 input and in inverted form via the inverter stage IV to the third UG2 input. The outputs of the two AND gates UG1, UG2 are applied separately to the counting input of the first and second forward counters Z1 and Z2, respectively, with the outputs thereof being connected to the inputs of the digital subtractor circuit SS1. As is denoted in FIG. 1 by the broad arrowline between the two forward counters Z1, Z2 and the digital subtractor circuit SS1, this connection denotes the transmission of parallel digital signals. Thus, the respective counter readings (counts) of the two forward counters Z1, Z2 are transferred in parallel form to the associated inputs of the digital subtractor circuit SS1 at the output of which the digital phase difference signal PhD is present.

Accordingly, the two forward counters Z1 and Z2, during successive half cycles of the divider output signal IF, count the pulses of the clock signal TF occurring during this period including noise or noise pulses. Owing to the subtraction carried out in the digital subtractor circuit SS1, the average is taken throughout the time of each reference pulse period. Accordingly, the phase difference becomes zero whenever the edges of the switching signal SF appear in the center of the pulses of the reference signal RF. Upon the occurrence of statistically distributed noises or noise pulses, the phase difference approximately remains equal to zero, or fluctuates in (the case of low-frequency noise) around the respective measured phase difference value.

Accordingly, without any restriction of the measuring range, it is thus possible to measure the phase difference throughout the entire period of the reference signal.

From the block diagram of FIG. 2, it will be shown that the measured phase difference is used for frequency correction, i.e., for continuously changing the division ratio of the preset and controllable frequency divider FT (FIG. 1). Thus, it is possible to synchronize the pulse sequence IF by the sequence of reference pulses RF. This is advantageously effected in that the measured phase differences are averaged in terms of time throughout a larger number of periods of the sequence of reference pulses, with the measured frequency deviation resulting therefrom.

Accordingly, in FIG. 2, the above-mentioned preset and controllable frequency divider is designed as an m-stage binary divider FTe, with m being an integer. The binary divider FTe has a resetting input RS so that it, prior to reaching its end state, can restart counting, i.e., with the aid of a signal applied to the resetting input, its division ratio can be adjusted in a conventional way. Alternatively, it is also possible to use frequency dividers which are capable of being preset in other ways; for example, it is possible to use forward counters which, depending upon the measured phase difference, are preset to predetermined counter readings (counts).

The number of periods of the sequence of reference pulses, RF throughout which the phase difference PhD is averaged, is equal to an n-th power of two, with n being integral and at least equal to five. For this purpose, with the aid of the n-stage second binary divider BT2 there is controlled the one input of the sequence control AS, to the other input of which the sequence of reference pulses RF is applied. This sequence control and the second binary divider BT2, during the period of one counter cycle, produce a pulse having a one counter cycle duration and, from this, each time one short pulse which is in synchronism with the leading or the trailing edge, respectively.

The sequence control AS consists, for example, of an R-S flip-flop and a differentiator. The R-input and the S-input are fed by the input and the output signal of the binary divider BT2, respectively, and a built-in differentiator differentiates the output signal of this R-S flip-flop to provide pulses in a conventional manner. The two pulses are applied to the respective enable input of third and fourth memories SP3, SP4, to the inputs of which the phase difference digital signal PhD is applied. Thus, at the beginning of a cycle of the binary divider BT2, the momentary phase difference value is transferred into the third memory SP3 and, likewise, the momentary value appearing at the end of the divider cycle, is transferred into the fourth memory SP4. These two momentary values are digitally subtracted from one another in the digital subtractor stage SS2, with the output binary values thereof being divided by the number $2^n$ in the n-stage binary divider BT1, by omitting the last n least significant bits.

Accordingly, at the output of BT1 a signal of digital value is produced describing the average phase difference during the period of the cycle of the second binary divider BT2. BT2 is likewise of the n-stage type. This average phase difference, however, represents the frequency deviation. The corresponding digital signal at the output of the n-stage binary divider BT1 is thus applied to the one input of the first digital adder circuit A1. To the other input of A1 there is applied the digital signal contained in the first memory SP1. The output signal thereof is applied to one input of the second digital adder circuit A2 to the other input of which there is applied the phase difference signal PhD. The output signal of A2 is fed to the inputs of the first memory SP1.

Moreover, the output of the first memory SP1 is connected to one input of the first coincidence gate KG1, with the other inputs thereof being responsive to the counter reading outputs of the adjustable frequency divider FTe. Gate KG1 is a multiple AND gate, for example. The output of KG1 is applied at RS to the resetting input of the presetable frequency divider FTe. Accordingly, when the memory content of the first memory ST1 and the counter reading (count) of the presetable frequency divider FTe are alike, there is effected this resetting signal RS. Accordingly, the memory content is determinative of the division factor of the frequency divider FTe.

Still further, the output of the first memory SP1 is also connected to one set of inputs of the second coincidence gate KG2 which may also be a multiple AND gate, but in such a way that the stored binary word is applied to the second coincidence gate KG2 without the least significant bit thereof. To the other set of digital inputs of KG2 are applied the output signals of m stages of the presetable frequency divider FTe. The output signals of the frequency divider FTe are compared in the coincidence gate KG2 with the binary word in the memory SP1, divided by two.

Wherever the wide signal lines are shown, it will be understood that parallel lines discretely carry the digits of a digital word.

The output of the second coincidence gate KG2 is applied to the S-input, and the output of the last frequency divider stage of FTe is applied to the R-input of the R-S flip-flop FF. At the Q- or $\overline{Q}$-output of FF, respectively, appears the switching signal SF or the switching signal $\overline{SF}$ as inverted in relation thereto. By suppressing the least significant bit of the memory content of the first memory SP1 and the counter reading (count) of the presetable frequency divider FTe it is thus accomplished in conjunction with the R-S flip-flop FF, to meet the requirement according to which the switching signal must have double the frequency of the output signal IF and a pulse/no-pulse ratio of 1:1.

The activating (enabling) input of the first memory SP1 is connected via the first delay stage VS1 to the Q-output of the R-S flip-flop FF. The delay time is chosen such that after a predetermined number of pulses of the clock pulse signal TF, the output signal of the second digital adder A2 is transferred into the first memory SP1.

Moreover, into the connecting lines between the output of the first forward counter Z1 and the associated inputs of the digital subtractor circuit SS1 there is inserted a second memory SP2, to the enabling input of which there is connected the Q-output of the R-S flip-flop FF through the second delay stage VS2. The delay time of VS2 is greater than that of the first delay stage VS1.

One advantage the invention offers is that it can be realized exclusively with the aid of basic conventional digital circuits and components which, in particular, makes it possible to integrate it in accordance with the well known insulated-gate field-effect transistor technology, i.e., the so-called MOS technology. Also, the more detailed further embodiment as shown in FIG. 2 can serve as a syncrhonizer. For the preferred use with television receivers, it can be readily integrated in accordance with conventional MOS technology.

It is noted that it is usually also possible to use bipolar circuit concepts to facilitate circuit integration purpose, such as the so-called integrated injection logic technique ($I^2L$).

It will be realized that the invention is consistent with the trend calling for replacement of the hitherto conventional techniques of analog signal processing in television receivers, by digital techniques. In contrast with conventional analog horizontal synchronizers, the invention provides a digital horizontal synchronizer of novel type.

What is claimed is:

1. A digitized circuit for measuring phase difference between a sequence of reference pulses and a pulse sequence, comprising:

first means including a clock pulse generator operating at a frequency which is at least an order of magnitude higher than that of said pulse sequence and a frequency divider responsive to said clock pulse generator for producing a switching signal at a frequency twice that of said pulse sequence and having a pulse/no-pulse ratio of 1 to 1;

second means including a first logical AND circuit having inputs responsive to said clock signal, said sequence of reference pulses and said switching signal, said AND circuit supplying output pulses during coincidence of signals at said first logical AND circuit;

first forward counting means responsive to said first logical AND circuit for producing a digital count in parallel form during the time of output pulses from said first logical AND circuit;

third means including an inverter and a second logical AND circuit having inputs responsive to said clock signals, said sequence of reference pulses and, through said inverter, said switching signal in inverted form;

a second forward counting means responsive to the output of said second logical AND circuit for producing a digital count in parallel form during the time of output pulses from said second logical AND circuit;

and fourth means including a digital subtractor responsive to said parallel digital counts from said first and second forward counters to produce a digital signal representative of said phase difference.

2. A device according to claim 1 adapted to synchonize said pulse sequence to said sequence of reference pulses and further comprising;

means within said frequency divider responsive to a ratio control signal to control the division ratio of said divider, said divider being resetable and having a reset input; and averaging means comprising a plurality of digital memories and sequencing control circuits therefor to generate said digital representation of said phase difference as a function of the average phase difference measured over a plurality of periods of said sequence of reference pulses.

3. A device according to claim 2 further defined in that:

said resetable frequency divider is an m-stage binary divider, m being an integer and said plurality of periods of said phase difference measurement is equal to an n-th power of two, where n is an integer at least equal to five, said first and second forward counting means comprising separate counters;

in which there are included a digital subtractor, a first n-stage binary divider, a first digital adder circuit, a second digital adder circuit, first and second memories with enable control inputs, a first coincidence gate, a second coincidence gate, an R-S flip-flop, and first and second delay stages;

in which two momentary phase difference signals corresponding to the beginning and end of the time of said average phase measurement are fed to said digital subtractor, the output of said n-stage binary divider being applied to an input of said first digital adder circuit;

in which said fourth means output is applied to an input of said second digital adder circuit, the digital output of said second digital adder circuit is applied to said first memory circuit, the output of said first memory being connected to the other input of said first digital adder circuit and to an input of said first coincidence gate;

in which the other input of said first coincidence gate is responsive to the output of said m-stage binary divider, the output of said first coincidence gate being applied to the resetting control input of said m-stage binary divider;

in which one input of said second coincidence gate is responsive to the binary word contained in said first memory without its least significant bit, the other input of said second coincidence gate being responsive to the output of said m-stage binary divider;

in which the output of said second coincidence gate is applied to the S input of said R-S flip-flop, the Q and $\bar{Q}$ outputs of said flip-flop providing the switching signal and inverted switching signal, respectively; and in which said enable input of said first memory is connected via said first delay stage from said flip-flop $\bar{Q}$ output, the output of said first forward counter being applied via said second memory to said digital subtractor, said enable input of said second memory being connected to said flip Q output via said second delay stage.

4. A device according to claim 1 in which said first and second forward counting means comprise a single forward-backward counter and in which means are included for effecting alternating forward and backward counting during the period of said pulse sequence.

5. A digital system for measuring the phase difference between a reference pulse sequence and a second pulse sequence, said system comprising:

first means for providing clock signals at a frequency which is at least an order of magnitude higher than the frequency of said second pulse sequence;

frequency divider means having an input coupled to said first means for dividing the frequency of said clock signals to provide said second pulse sequence and for providing switching signals having a frequency higher than and having a predetermined harmonic relationship to the frequency of said second pulse sequence;

first counting means for counting first coincidences of pulses of said reference pulse sequence and said clock signals during each first half cycle of said switching signals to produce first count outputs representative of said first coincidences;

second counting means for counting second coincidences of pulses of said reference pulse sequence and said clock signals during each second half cycle of said switching signals to produce second count outputs representative of said counted second coincidences; and second means for generating digit output signals representative of the difference between said counted first and said counted second coincidences.

6. A digital system in accordance with claim 5 further comprising averaging means responsive to said digital output signals for averaging said difference over a plurality of periods of said reference pulse sequence.

7. A digital system in accordance with claim 5 wherein said first counting means comprises: a first up-counter; and first logic means for providing first clock signals to said first up-counter for each coincident occurrence of pulses of said reference pulse sequence, and said clock signals during said each first half cycle.

8. A digital system in accordance with claim 6 wherein said second counting means comprises:
a second up-counter; and
second logic means for providing second clock signals to said second up-counter for each coincident occurrence of pulses of said reference pulse sequence and said clock signals during said each second half cycle.

9. A digital system in accordance with claim 8 wherein said second means comprises a digital subtractor circuit.

10. A digital system in accordance with claim 5 wherein said first counting means comprises an up-down counter and logic means for effecting counting by said up-down counter in a first direction; and wherein said second counting means comprises said up-down counter and logic means for effecting counting by said up-down counter in a second direction.

11. A digital system in accordance with claim 10 wherein said second means comprises means for reading the output of said up-down counter at predetermined time intervals.

12. A digital system in accordance with claim 11 comprising averaging means responsive to said digital output signals for averaging said difference over a plurality of periods of said reference signal.

13. A digital system in accordance with claim 6 wherein said plurality of periods is equal to $2^n$ where n is an integral number at least equal to 5.

14. A digital system in accordance with claim 6 wherein said averaging means comprises:
first means for storing said digital output signals at first periodically recurring intervals;
second means for storing said digital output signals at second periodically recurring intervals, each of said second periodically recurring intervals occurring between adjacent ones of said first periodically recurring intervals and having a fixed relationship in time thereto;
means for periodically reading said digital output signals stored in said first storing means and for reading said digital output signals stored in said second storing means for obtaining the difference between the values represented by said read first storing means digital output signals and said read second storing means digital output signals, and for dividing said difference by a predetermined quantity.

15. A digital system in accordance with claim 14 wherein said plurality of periods is equal to $2^n$, where n is an integer at least equal to 5.

16. A digital system in accordance with claim 15 wherein said first periodically recurring intervals is equal to $2^n$ of said periods, said second periodically recurring intervals is equal to 2n of said periods and said predetermined quantity is $2^n$.

17. A digital system comprising:
a first terminal for receiving a reference pulse sequence;
a second terminal for receiving a clock pulse sequence;
means for generating a second pulse sequence;
means for generating switching signals having a frequency higher than and having a predetermined harmonic relationship to the frequency of said second pulse sequence; and
means for counting first coincidences of pulses of said reference pulse sequence and said clock signals during each first half cycle of said switching signals and for counting second coincidences of pulses of said reference pulse sequence and said clock signals during each second half cycle of said switching signals and for generating momentary phase difference signals by determining the difference between said first and second coincidences of pulses.

18. A digital system in accordance with claim 17 comprising averaging means responsive to said momentary phase difference signals for averaging said phase difference signals over a plurality of periods of said reference pulse sequence to generate average phase difference signals.

19. A digital system in accordance with claim 18 wherein said plurality of periods is equal to $2^n$ where n is an integer at least equal to 5.

20. A digital system in accordance with claim 18 wherein said averaging means comprises:
first means for storing said momentary phase difference signals occurring at first periodically recurring intervals;
second means for storing said momentary phase difference signals occurring at second periodically recurring intervals;
means for periodically reading said momentary phase difference signals stored in said first storing means and said momentary phase difference signals stored in said second storing means and for generating an average phase difference signal by obtaining the difference between said momentary phase difference signals read from said first and second storing means and by dividing said difference by a predetermined factor.

21. A digital system in accordance with claim 20 wherein:
said plurality of periods is equal to $2^n$ where n is an integer at least equal to 5;
said first periodically recurring intervals occur at time intervals spaced apart by a time equal to $2^n$ reference periods;
said second periodically recurring intervals occur at time intervals spaced apart by a time interval equal to $2^n$ reference periods; and
said predetermined factor is equal to $2^n$.

22. A digital system in accordance with claim 18 comprising means for generating control signals in response to said momentary phase difference signals and said average phase difference signals.

23. A digital system in accordance with claim 22 wherein said second pulse sequence generating means comprises frequency dividing means coupled to said second terminal for dividing the frequency of said clock pulse sequence by a division ratio to generate said second pulse sequence, said frequency dividing means being responsive to said control signals to vary said division ratio.

24. A digital system in accordance with claim 23, wherein said control signal generating means comprises:

first memory means for storing intermediate control signals;

adding means for adding said average phase difference signals, said momentary phase difference signals and prior said intermediate control signals to generate said intermediate control signals; and means responsive to said intermediate control signals and signals representative of the state of said frequency divider for generating said control signals.

25. A digital system in accordance with claim 24 wherein said switching signals generating means comprising:

a flip-flop having a pair of inputs and at least one output providing said switching signals, one of said pair of inputs being adapted to receive said second pulse sequence; and logic means for supplying signals to the other of said pair of inputs in responsive to said signals representative of the state of said frequency divider and a predetermined portion of said intermediate control signals.

26. A digital system for use with a reference pulse sequence and a pulse sequence comprising:

a first terminal for receiving reference pulse sequence;

a second terminal for receiving a clock pulse sequence having a frequency at least an order of magnitude higher than said pulse sequence;

a frequency divider coupled to said second terminal for generating said pulse sequence;

means coupled to said frequency divider for generating switching signals from said clock pulse sequence, said switching signals having a frequency twice that of said pulse sequence;

first logic means for supplying first output pulses during coincidence of said clock pulse sequence and said reference pulse sequence during first half cycles of said switching signals;

second logic means for supplying second output pulses during coincidences of said clock pulse sequence and said reference pulse sequence during second half cycles of said switching signals;

first counting means for counting said first output pulses;

second counting means for counting said second output pulses; and first means responsive to said first and second counting means for generating first digital phase difference signals from the difference in counts between said first and second counting means.

27. A digital system in accordance with claim 26 comprising averaging means for generating a digital representation of the average phase difference between said reference pulse sequence and said pulse sequence as a function of the average of the phase difference represented by said first digital phase difference signals over a time period equal to a predetermined plurality of periods of said reference pulse sequence.

28. A digital system in accordance with claim 27 wherein said frequency divider has a control input and is responsive to a ratio control signal at said control input for controlling the division ratio of said frequency divider; and comprising:

means responsive to said average phase difference digital representation and said first digital phase difference signals for generating said ratio control signal.

29. A digital system in accordance with claim 28 wherein said predetermined plurality of periods is equal to $2^n$ where n is an integer at least equal to 5.

30. A digital system in accordance with claim 29 wherein said averaging means comprises:

a digital subtractor; and means for applying to one input of said digital subtractor said first digital phase difference signals occurring at the beginning of said time period and for applying to a second input of said digital subtractor, said first digital phase difference signals occurring at the end of said time period;

said digital subtractor providing output signals representative of the difference between said first digital phase difference signals occurring at said beginning and said end of said time period; and means responsive to said output signals for dividing said difference representative by a predetermined factor to obtain signals representing the average phase difference.

31. A digital system in accordance with claim 30 wherein said applying means comprises:

a first memory having inputs coupled to said first means and outputs coupled to said digital subtractor one input;

a second memory having inputs coupled to said first means and outputs coupled to said digital subtractor second inputs;

and control means for storing in said first memory said first digital phase difference signals occurring at the beginning of said time period and for storing in said second memory means said first digital phase difference occurring at the end of said time period.

32. A digital system in accordance with claim 31 wherein said control means comprises:

an n-stage binary counter having an input coupled to said first terminal; and sequence control logic having a first input coupled to the output of said n-stage binary counter, a second input coupled to said first terminal and outputs coupled to said first and second memories for controlling operation thereof.

33. A digital system in accordance with claim 28 wherein said switching signal generating means comprises control logic means for generating said control signal in response to said first digital phase difference signals and said average phase difference digital representation.

34. A digital system in accordance with claim 33 wherein said control logic means comprises:

a third memory;

an adder circuit arrangement having a first addend inputs coupled to outputs of said digital subtractor, second addend inputs coupled to outputs of said averaging means, third addend inputs coupled to outputs of said third memory, and outputs coupled to inputs of said third memory; and third logic means having first inputs coupled to said third memory outputs, second inputs coupled to said frequency divider and an output coupled to said frequency divider control input.

35. A digital system in accordance with claim 33 comprising fourth logic means having first inputs coupled to said third memory outputs, second inputs coupled to said frequency divider and an output, said logic means being responsive to the binary word stored in said third memory without its least significant bit for generating signals at said output upon coincidence of signals at said first and second inputs;

an R-S flip-flop having one input coupled to said fourth logic means output and its other input coupled to said frequency divider for receiving said pulse sequence, and having outputs providing said switching signals.

36. A digital system in accordance with claim 5 adapted for use in a television receiver or the like wherein said reference pulse sequence is a received synchronization signal train.

37. A digital system in accordance with claim 17 adapted for use in a television receiver or the like wherein said reference pulse sequence is a received synchronization signal train.

38. A digital system in accordance with claim 18 adapted for use in a television receiver or the like wherein said reference pulse sequence is a received synchronization signal train.

39. A digital system in accordance with claim 19 adapted for use in a television receiver or the like wherein said reference pulse sequence is a received synchronization signal train.

40. A digital system in accordance with claim 20 adapted for use in a television receiver or the like wherein said reference pulse sequence is a received synchronization signal train.

41. A digital system in accordance with claim 21 adapted for use in a television receiver or the like wherein said reference pulse sequence is a received synchronization signal train.

42. A digital system in accordance with claim 22 adapted for use in a television receiver or the like wherein said reference pulse sequence is a received synchronization signal train.

43. A digital system in accordance with claim 23 adapted for use in a television receiver or the like wherein said reference pulse sequence is a received synchronization signal train.

44. A digital system in accordance with claim 24 adapted for use in a television receiver or the like wherein said reference pulse sequence is a received synchronization signal train.

45. A digital system in accordance with claim 25 adapted for use in a television receiver or the like wherein said reference pulse sequence is a received synchronization signal train.

* * * * *